United States Patent [19]
Decker et al.

[11] Patent Number: 5,390,083
[45] Date of Patent: Feb. 14, 1995

[54] APPARATUS AND METHOD FOR STIFFENING CIRCUIT CARD ASSEMBLIES

[75] Inventors: Edmund C. Decker, Omaha, Nebr.; Richard A. Miller, Glendale, Ariz.

[73] Assignee: Honeywell Inc., Minneapolis, Minn.

[21] Appl. No.: 129,518

[22] Filed: Sep. 30, 1993

[51] Int. Cl.6 .................. H05K 7/14; H01R 13/64; H01S 4/00
[52] U.S. Cl. .................. 361/796; 361/752; 361/756; 361/758; 361/801; 211/41; 439/64; 439/374; 29/592.1; 437/51
[58] Field of Search .................. 439/64, 374, 377; 361/730, 732, 736–737, 740–742, 752–754, 756, 804, 758–759, 796–798, 801–802; 211/41; 174/52.1; 29/592.1; 437/51

[56] References Cited
U.S. PATENT DOCUMENTS

| | | | |
|---|---|---|---|
| 3,479,568 | 11/1969 | Shapiro et al. | 361/801 |
| 4,051,549 | 9/1977 | Fiege | 361/752 |
| 4,318,157 | 3/1982 | Rank et al. | 361/704 |
| 4,327,835 | 5/1982 | Leger | 211/41 |
| 4,503,484 | 3/1985 | Moxon | 361/730 |
| 5,009,311 | 4/1991 | Schenk | 206/332 |

Primary Examiner—Bot Ledynh
Attorney, Agent, or Firm—Kenneth J. Johnson; Thomas A. Rendos

[57] ABSTRACT

A stiffening device for an electronic assembly which engages each circuit card assembly (CCA) in approximately its center of area. Each CCA which is positioned within an electronic enclosure has a collar which surrounds a hole through its center of area. A shaft is passed through the electronic enclosure and pins engage each of the collars. The shaft and pin assembly rigidly connects each of the CCA's to the body of the electronic enclosure. This has the effect of reducing the vibrational deflection and potential damage to each CCA, allowing the electronic enclosure to survive a much higher vibrational and shock environment.

18 Claims, 7 Drawing Sheets

APPARATUS AND METHOD FOR STIFFENING CIRCUIT CARD ASSEMBLIES

FIELD OF THE INVENTION

This invention relates to electronic enclosures which hold circuit card assemblies, and more specifically to stiffening the circuit cards within the enclosure.

BACKGROUND OF THE INVENTION

It is a well known form of electronics packaging to mount circuit card assemblies (CCA's) within an electronic enclosure. The CCA's are either secured by their edges, their corners or a combination of both. These electronic assemblies are included on many vehicles such as airplanes, missiles, spacecraft or any other vehicle which develops vibrational and/or shock forces. The effects of shock and vibration are manifested in several detrimental ways. For example, the cards themselves are constructed of a dielectric material which is somewhat brittle and subject to cracks if permitted to vibrate. These cracks may extend across conductive circuit patterns and cause intermittent or total interruption of the conduction paths. Vibration can also weaken or interrupt component solder joints and cause loosening, interruption or loss of component, as well as change electrical/electronic characteristics.

One way to reduce vibrationally induced damage to each CCA is to mount each CCA such that the natural frequency, $f_n$, of the card is increased. Raising the $f_n$ decreases the deflection of the CCA during vibration, thereby reducing its stress. However, devices which have been created for this purpose have the effect of reducing the area available for mounting electronic components or adding proportionally more weight and increasing the size of the assemblies. It is important that any stiffening scheme not significantly reduce the CCA's size thereby increasing the number of CCA's required along with the number of inner connections and connectors. Further, the addition of more CCA's would result in an increase in the size of the mother board, an increase in size and weight of the total assembly, and a decrease in the reliability of the overall system.

Therefore it is the object of this invention to provide a stiffening device which is light weight, cost effective and does not significantly reduce the CCA usable area.

SUMMARY OF THE INVENTION

There is provided an electronic assembly. The electronic assembly is comprised of an electronic enclosure and a plurality of CCA's. Each CCA has a hole as close as practical through its center of area which is aligned with the holes through the other CCA's which are positioned within the enclosure. A collar is mounted on each CCA and aligned with the hole which passes through each CCA. A removable rigid attachment device is inserted into the enclosure and passed through the hole and collar of each CCA. The attachment device engages each of the collars and rigidly holds the center of the CCA with respect to the enclosure. Rigidly holding the center of each CCA has the effect of increasing the card's $f_n$, thus decreasing the deflection during vibration or shock environments.

DESCRIPTION OF THE PREFERRED EMBODIMENT

Figure 1:
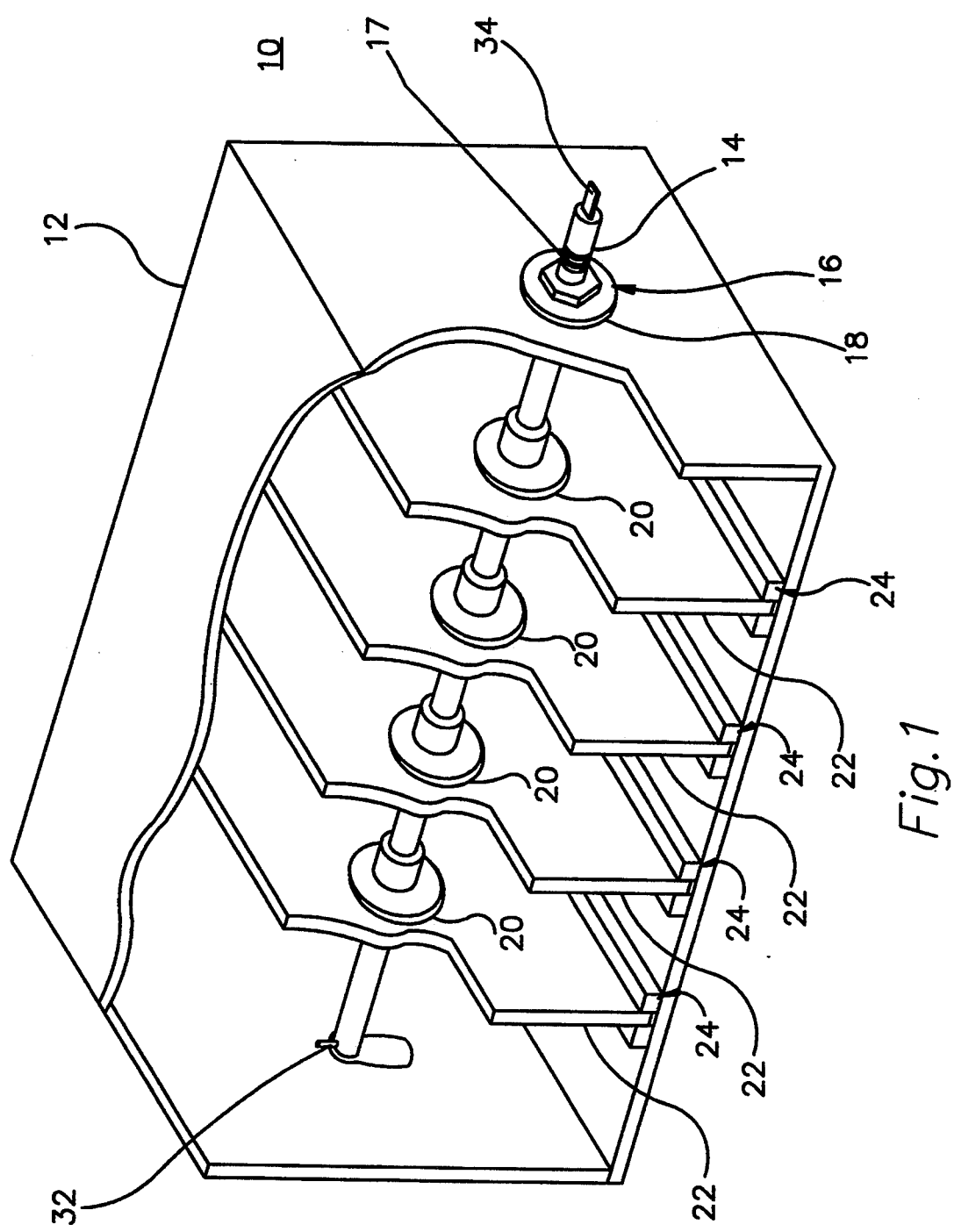
FIG. 1 shows an orthogonal cutaway view of the CCA's locked within the electronic enclosure.

FIG. 1 shows the electronic assembly 10. Included in the assembly is the electronic enclosure 12 which holds the circuit card assemblies (CCA's) 22. Running along the bottom and top of the electronic enclosure 12 are the circuit card guides 24. The guides in this embodiment are U-shaped channels in which the edges of the CCA's 22 are held. For insertion of the CCA's, one side of the electronic enclosure 12 is opened and the CCA's are aligned with guides and slid into the enclosure.

Also shown in FIG. 1 is the shaft and pin assembly 14 which passes through an outer wall of the enclosure, through each of the CCA's, and then through the opposite enclosure wall. The shaft and pin assembly 14 is held within enclosure 12 through the use of front exterior fastener 16 and front washer 18. The fastener 16 threads on to the threaded portion 17 of the shaft and pin assembly 14. At the end of the shaft and pin assembly 14 is the flat end 34 which is used to rotate the shaft and pin assembly within enclosure.

Figure 2:
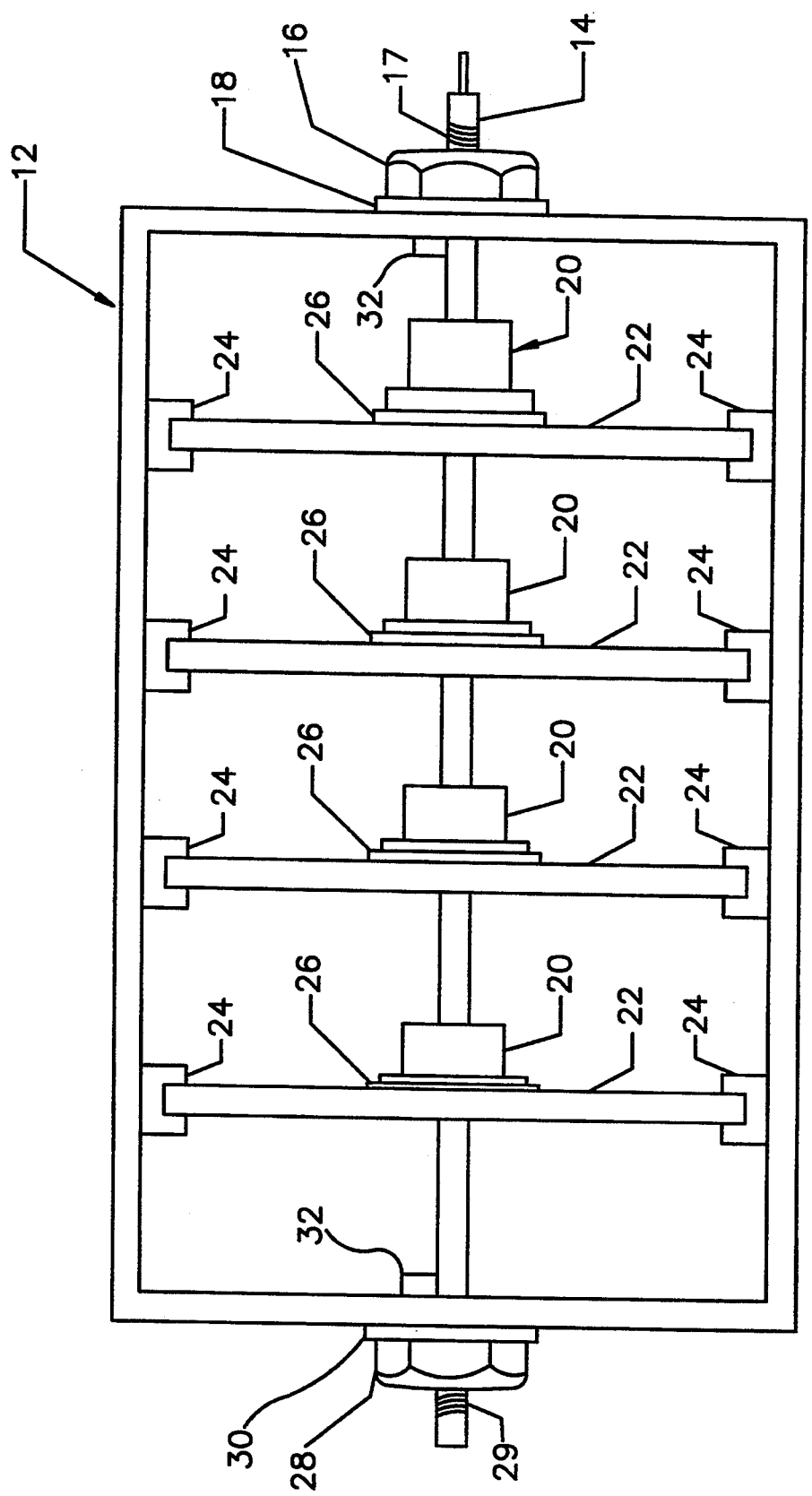
FIG. 2 shows a side view of the CCA's locked within the enclosure.

FIG. 2 shows a side view of the electronic enclosure 12. The CCA's 22 are seen mounted within the enclosure. Attached to each of the CCA's is a collar 20. Between the collar 20 and each CCA is an elastomeric washer 26. The shaft and pin assembly pass through each of the collars 20 and elastomeric washers 26 and then extends out through the rear wall. Nut 28, which is identical to nut 16 threads onto threaded portion 29 along with washer 30 to attach the shaft and pin assembly 14 to enclosure 12.

Figure 3:
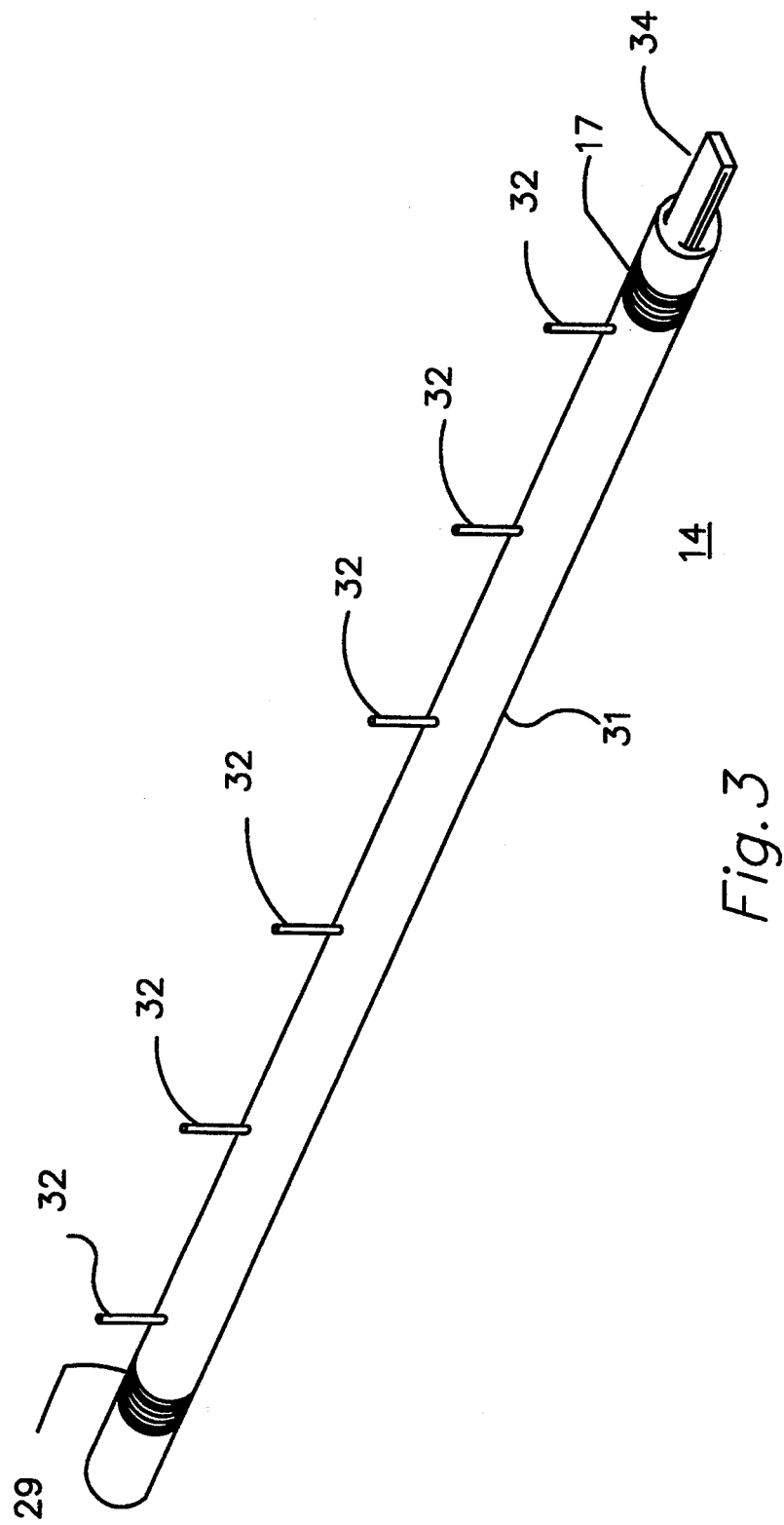
FIG. 3 shows the shaft and pin assembly.

The shaft and pin assembly 14 is shown in FIG. 3. The assembly is comprised of a shaft 31, and a plurality of pins 32 which extend out as shown. The shaft 31 is long enough to pass completely through the electronic enclosure and extend outside the enclosure on both ends. Threaded portions 17 and 29 are at opposite ends of the ends of the shaft 31. The pins are positioned on the shaft at predetermined distances, compatible with the collars 20. In a preferred embodiment of the invention, the pins are cylindrical in shape and have a diameter significantly less than the diameter of the shaft. The pins are sized so that they may pass through the collars 20 on the circuit cards 22.

Figure 4:
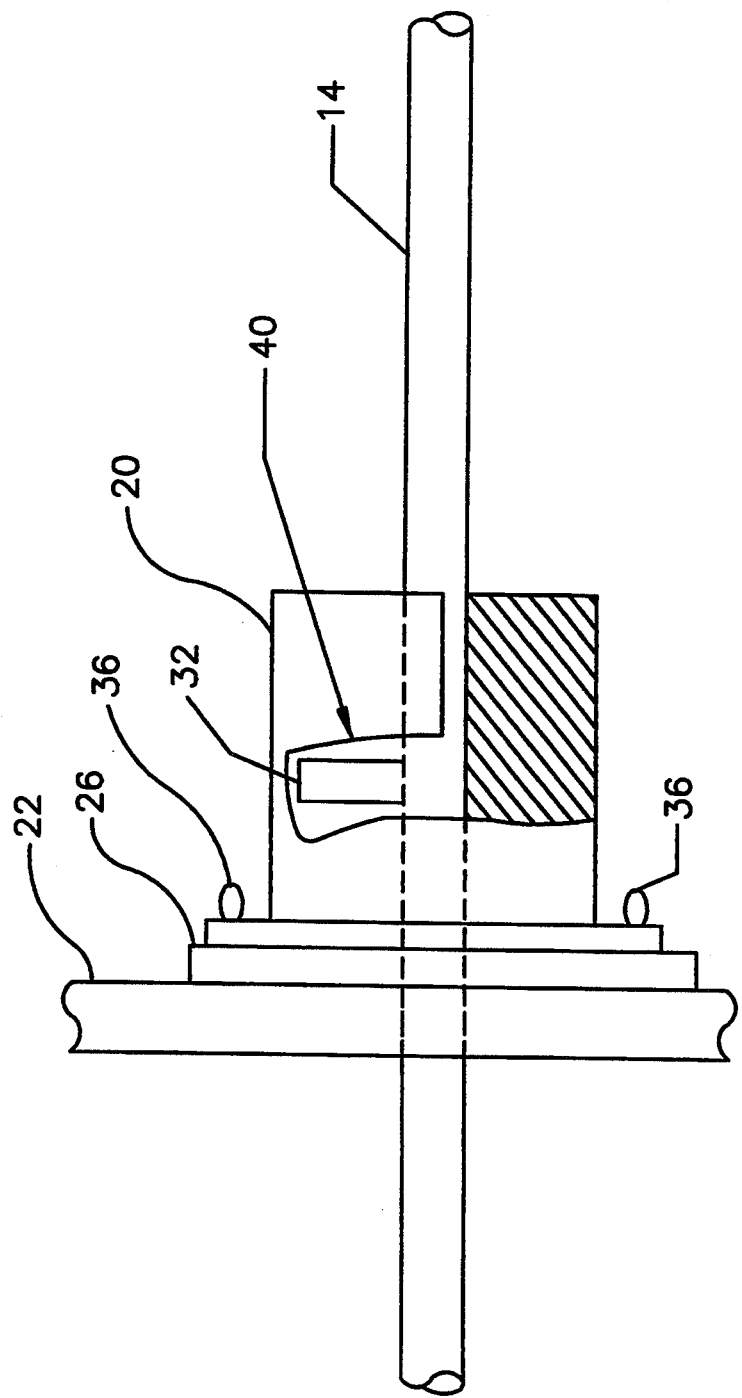
FIG. 4 shows a cutaway view of the pin locked within the collar.
Figure 5:
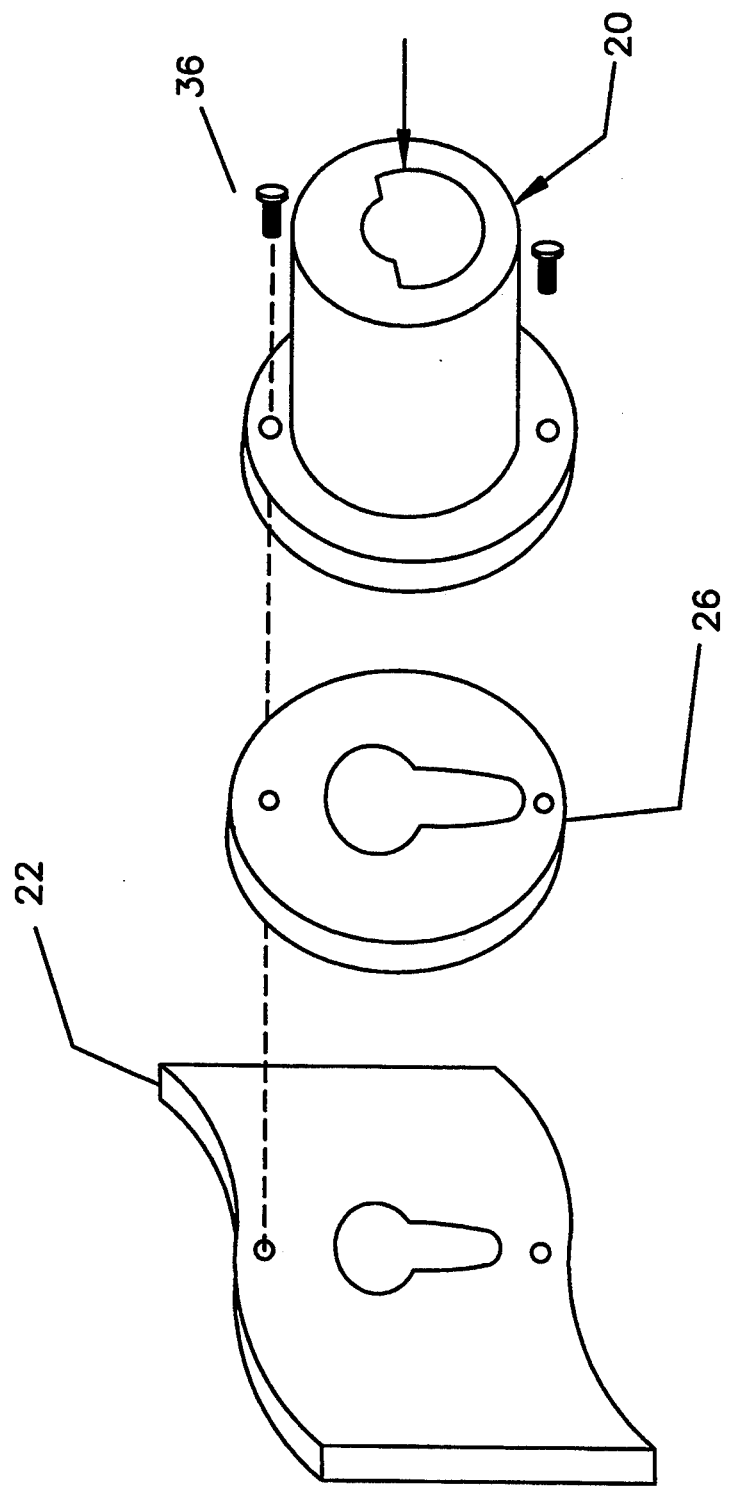
FIG. 5 shows an exploded view of the collar attached to the CCA.

Shown in FIG. 4 is a cross sectional view of a collar 20 attached to a CCA 22. The collar is attached to the CCA with fasteners 36. Elastomeric washer 26 is positioned between the circuit card and the collar to absorb vibration and shock energy. FIG. 5 shows an exploded view of the collar, fasteners, elastomeric washer, and CCA 22. Note that the CCA opening, the hole through the elastomeric seal, and the passage through the collar are all of the shape to allow the shaft and pin assembly to pass through.

It is also seen in FIG. 4 that the collar is machined with a cavity that is large enough to receive one of the pins. This cavity is in communication with the passage through the collar. The passage and cavity combination within the collar allow the shaft and pin assembly to be inserted within the collar and then as the shaft is rotated up into the cavity, it secures the CCA to the shaft and pin assembly.

When the electronic enclosure is empty, the CCA's are slid into the electronic enclosure through the card guides. Once the CCA's are loaded, the shaft and pin assembly is inserted through the opening in one end of the electronic enclosure. The shaft and pin assembly is run through all of the collars on each CCA until it extends out the other end of the enclosure. The pins are aligned so that they simultaneously pass through the openings in each of the collars. Once the shaft and pin assembly is fully inserted in the enclosure, the pins should be positioned within each of the collars. The shaft is then rotated and each of the pins is cam locked within the cavities. This process rigidly locks the shaft to each of the CCA's. In order to lock the shaft and pin assembly to the electronic enclosure, the exterior fasteners 16 and 28 and washers 18 and 30 are positioned over the end or ends of the shaft and pin assembly which extends beyond the enclosure. The fastener 16 is then rotated with a wrench or other means onto the threaded portion 16 until the washer 18 is compressed against enclosure 12. The pin 32 on the opposite side of the enclosure wall protects against over-tightening and deforming the enclosure wall. This procedure is repeated with fastener 28, washer 30 and threaded portion 29. The order in which the exterior fasteners are tightened is unimportant. The CCA's are now rigidly locked to the enclosure. The CCA's can later be removed by untightening and removing the fasteners on either end of the electronic enclosure, rotating the pins out of the CCA cavities and then withdrawing the shaft and pin assembly from the enclosure.

Figure 6:
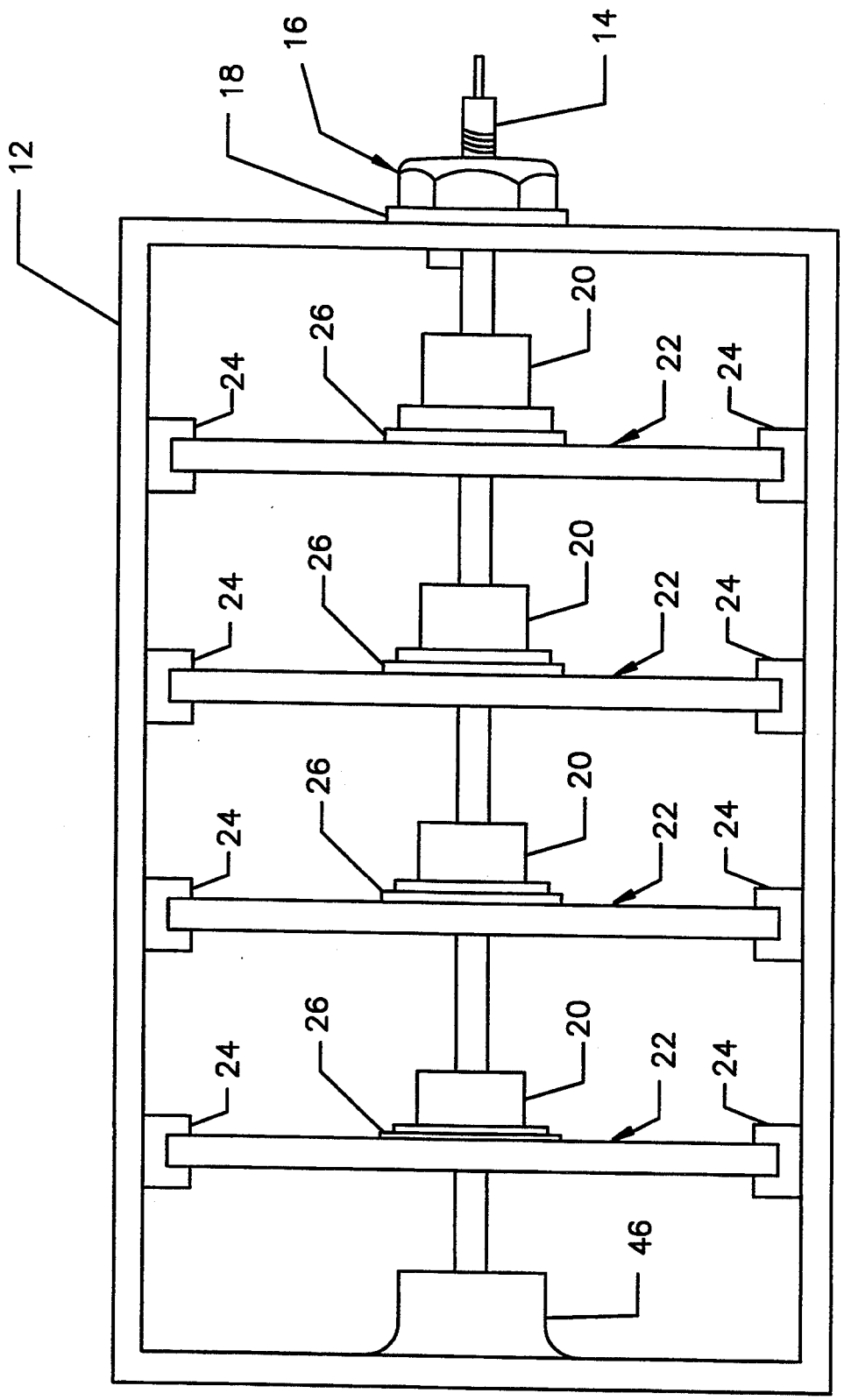
FIG. 6 shows a side view of the CCA's locked within the enclosure through use of a protrusion machined into one wall of the enclosure.
Figure 7:
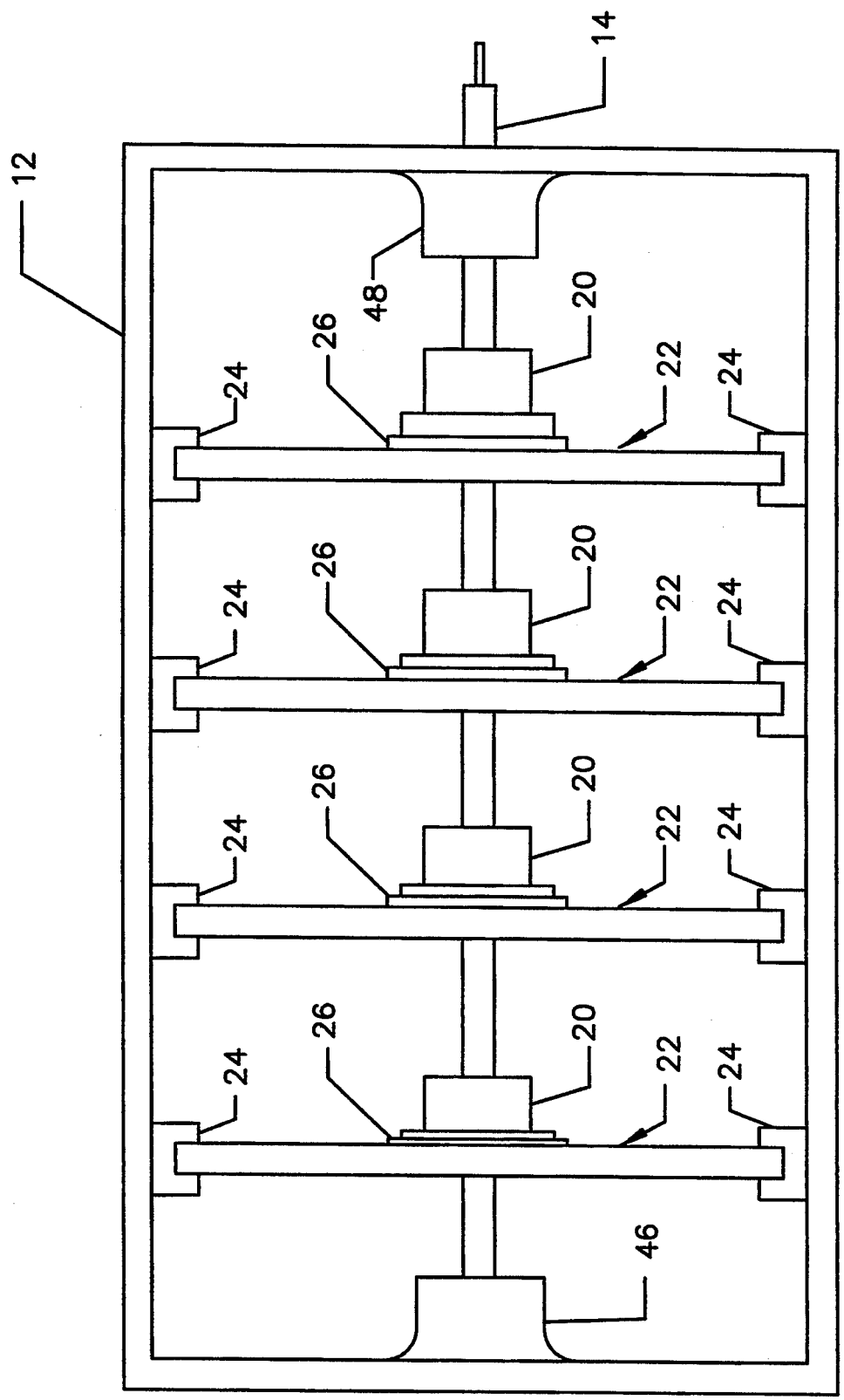
FIG. 7 shows a side view of the CCA's locked within the enclosure through use of a protrusion machined into two walls of the enclosure.

In another embodiment of the invention shown in FIG. 6, only one exterior fastener is required. Rearward protrusion 46 is an integral part of the enclosure and machined to accommodate one of the pins 32 of the shaft and pin assembly 14. The shaft and pin assembly is locked into rearward protrusion 46 when it is locked into the collars on the CCA's. The fastener 16 is then threaded and tightened onto the shaft and pin assembly holding the CCA's in place. The rearward protrusion 46 can also be machined with a countersunk hole to simply provide support for shaft and pin assembly 14.

In still another embodiment of the invention, shown in FIG. 8, a second protrusion 48 is machined on the interior of enclosure 12. This second protrusion also has an interior cavity into which a pin 32 extending from shaft 31 can be cam locked into. The shaft and pin assembly is locked into all the collars as well as the two protrusion with one turn of the shaft. One skilled in the art can see that the cam locking with interior protrusions can be used in a number of combinations with a threaded shaft and an exterior fastener.

The purpose of this electronic assembly is to provide a means to rigidly lock CCA's within an electronic enclosure. By rigidly locking each of the CCA's in approximately the middle of each CCA, the $f_n$ can be raised by a factor of approximately 2.5. This increased $f_n$ significantly decreases the amount of deflection of each CCA allowing each CCA to survive much higher vibration and shock environments. With the proper selection of CCA size and electronic enclosure design, the electronic assembly can also be used to decouple the CCA's $f_n$ so that it is safely outside the $f_n$ of the electronic enclosure. This will minimize the transmissibility of vibrations.

The elastomeric washers 26 installed between the CCA's and the collars provide further protection for the CCA's. These elastomeric washers absorb vibration which is transmitted from the electronic enclosure through the shaft and rod assembly to the CCA's. This further reduces the vibration levels so that the CCA and its components are able to withstand higher vibration levels. This effectively increases the component life and systems reliability.

The foregoing is a description of a novel and nonobvious apparatus and method for stiffening circuit card assemblies. The applicant does not intend to limit the invention through the foregoing description, but instead define the invention through the claims appended hereto.

We claim:

1. An enclosure assembly comprising:
    an enclosure means with interior and exterior surfaces;
    at least one platelike structure with opposing first and second sides and a hole which passes through from the first side to the second side,
    platelike structure positioning means within said enclosure for positioning and holding said platelike structures within said enclosure means in substantially a parallel fashion,
    collar means for engaging an external structure mounted on each of said platelike structure in a location proximate to the hole through said platelike structure; and
    a removable rigid attachment means with engagement pins that extend outward from said removable rigid attachment means, said removable rigid attachment means passes through each of said platelike structures and the engagement pins pass within and engage each of said collar means and rigidly attach each of said platelike structures to said enclosure means.

2. An electronic assembly comprising:
    electronic enclosure means with interior and exterior surfaces;
    at least one circuit card assembly (CCA) means for supporting and providing electrical connections between electronic components, each of said CCA means includes opposing first and second sides and a hole which passes from the first side to the second side;
    CCA positioning means for each of said CCA means, mounted on the interior surface of said electronic enclosure means for positioning and holding said CCA means within said electronic enclosure means in a substantially parallel fashion;
    collar means for engaging an external structure mounted on each of said CCA means in a location proximate to the hole through said CCA means; and
    a removable rigid attachment means with engagement pins that extend outward from said removable rigid attachment means, said removable rigid attachment means passes through each of said CCA means and the engagement pins pass within and engage each of said collar means and rigidly attach each of said CCA means to said electronic enclosure means.

3. The electronic assembly of claim 2 wherein a flexible washer is positioned between the collar means and each of said CCA means.

4. The electronic assembly of claim 3 wherein the washer is constructed of an elastomeric material.

5. The electronic assembly of claim 2 wherein the hole through each of the CCA means is located at substantially the center of area for each of the circuit card assembly means.

6. The electronic assembly of claim 2 wherein said rigid attachment means is a straight shaft, the engagement pins are cylindrical pins projecting out normal from the shaft, and the collar means is a metal ring formed with a cavity to receive and hold the pins.

7. The electronic assembly of claim 6, wherein the straight shaft has at least one threaded end and at least one nut and washer combination is used to attached said rigid attachment means to said electronic enclosure means.

8. The electronic assembly of claim 6, wherein at least one protrusion on the interior surface of said enclosure means receives one of said pins and attaches said rigid attachment means to said enclosure means.

9. A electronic assembly comprising:
an electronic enclosure with interior and exterior surfaces;
at least one circuit card assembly wherein a hole passes through each of said circuit card assemblies;
a circuit card positioning device for each of said circuit card assemblies, mounted on the interior surface of said electronic enclosure for positioning and holding said circuit card assemblies within said enclosure in a parallel fashion and aligning the holes through each of said circuit card assemblies in a straight line;
a collar mounted on each of said circuit card assemblies in a location encircling the holes through said circuit card assemblies; and
a removable rigid attachment device with engagement pins that extend outward from said removable rigid attachment device, said removable rigid attachment device passes through each of said circuit card assemblies within the electronic enclosure and the engagement pins pass within and engage each of said collars on said circuit card assemblies and rigidly attach each of said circuit card assemblies to said electronic enclosure.

10. The electronic assembly of claim 9 wherein a flexible washer is positioned between the collar and each of said circuit card assemblies.

11. The electronic assembly of claim 10 wherein the washer is constructed of an elastomeric material.

12. The electronic assembly of claim 9 wherein each of the holes through the circuit card assemblies are located at the center of area for each of the circuit card assemblies.

13. The electronic assembly of claim 9 wherein the rigid attachment device is a straight shaft, the engagement pins are cylindrical pins projecting out normal from the shaft, and the collar is a metal ring formed with a cavity to receive and hold the pins.

14. The electronic assembly of claim 13, wherein the straight shaft has at least one threaded end and at least one nut and washer combination is used to attach said rigid attachment device to said electronic enclosure.

15. The electronic assembly of claim 13, wherein at least one protusion on the interior surface of said enclosure receives one of said pins and attaches said rigid attachment device to said enclosure.

16. A method of providing circuit card assembly stiffening comprising;
providing an electronic enclosure with interior and exterior surfaces;
providing at least one circuit card assembly with a hole that passes through the circuit card assembly and a collar mounted on the circuit card assembly which encircles the hole;
mounting the circuit card assemblies within the enclosures so that the holes which pass through the assemblies are aligned; and
inserting a rigid attachment device with engagement pins that extend outward from said removable rigid attachment device into the enclosure so that the attachment device passes through each of said circuit card assemblies and the engagement pins pass within and engage each of the collars to rigidly attach each of the circuit card assemblies to the enclosure.

17. The method of providing circuit card assembly stiffening of claim 16 wherein the rigid attachment device is rotated within the collar to engage the device and the collar.

18. The method of providing circuit card assembly stiffening of claim 16 wherein opposite edges of the circuit card assemblies are rigidly held while the circuit card assembly is mounted within the enclosure.

* * * * *